(12) United States Patent
Habashy et al.

(10) Patent No.: US 7,642,785 B2
(45) Date of Patent: Jan. 5, 2010

(54) METHOD AND DEVICE FOR COMPLEX PERMITTIVITY MEASUREMENTS AS A FUNCTION OF FREQUENCY

(75) Inventors: Tarek M. Habashy, Danbury, CT (US); Nikita V. Seleznev, Ridgefield, CT (US); Mohammad-Reza Taherian, Sugar Land, TX (US); Austin J. Boyd, Ridgefield, CT (US)

(73) Assignee: Schlumberger Technology Corporation, Ridgefield, CT (US)

( * ) Notice: Subject to any disclaimer, the term of this patent is extended or adjusted under 35 U.S.C. 154(b) by 435 days.

(21) Appl. No.: 11/241,185

(22) Filed: Sep. 30, 2005

(65) Prior Publication Data

US 2007/0090846 A1 Apr. 26, 2007

(51) Int. Cl.
*G01V 3/00* (2006.01)
(52) U.S. Cl. .................................................. 324/376
(58) Field of Classification Search ................ 324/376, 324/377, 698, 693, 629, 633, 634, 636, 637, 324/638, 639; 439/578
See application file for complete search history.

(56) References Cited

U.S. PATENT DOCUMENTS

| 2,663,753 | A | * | 12/1953 | Bird | .................. | 174/88 C |
| 4,979,393 | A | * | 12/1990 | Leung et al. | ............. | 73/152.23 |
| 7,017,396 | B2 | * | 3/2006 | Mouhasseb | .................... | 73/73 |
| 2004/0025574 | A1 | * | 2/2004 | Mouhasseb | ................ | 73/61.41 |

OTHER PUBLICATIONS

Baker-Jarvis, J., Janezic, M.D., Riddle, B.F., Johnk, R., Kabos, P., Holloway, C.L., Geyer, R.G., Grosvenor, C.A. "Measuring the Permittivity and Permeability of Lossy Materials: Solids, Liquids, Metals, Building Materials, and Negative-Index Materials." NIST Technical Note 1536, Dec. 2004.
Bussey, H.E. "Measurement of RF Properties of Materials. A Survey." *Proc. IEEE*, vol. 55, No. 6, Jun. 1967: pp. 1046-1053.
Calvert, T.J., Rau, R.N., and Wells, L.E. "Electromagnetic Propagation . . . A New Dimension in Logging." SPE paper 6542, 1977.

(Continued)

*Primary Examiner*—Kenneth J Whittington
(74) *Attorney, Agent, or Firm*—Helene Raybaud; James McAleenan; Jody Lynn DeStefanis

(57) ABSTRACT

An apparatus for use in a system that includes a network analyzer for determining a property, such as dielectric permittivity of a sample material as a function of frequency, the apparatus including: a cylindrical chamber for receiving the sample; a coaxial connector having a first relatively small diameter end coupleable with the analyzer and a second relatively large diameter end communicating with a side of the cylindrical chamber, the connector having inner and outer coaxial conductors; the inner conductor of the connector having a diameter that tapers outwardly from the first end to the second end, and the outer conductor of the connector having an inner surface whose diameter tapers outwardly from the first end to the second end. The chamber can accommodate relatively large samples, such as standard earth formation coring samples.

19 Claims, 4 Drawing Sheets

OTHER PUBLICATIONS

Klein, L.A., and Swift, C.T. "An Improved Model for the Dielectric Constant of Sea Water at Microwave Frequencies." *IEEE Trans. Antennas Propagt.*, vol. AP-25, No. 1, Jan. 1977: pp. 104-111.

Rau, R.N. and Wharton, R.P. "Measurement of Core Electrical Parameters at Ultrahigh and Microwave Frequencies." SPE 9380, 55th Annual Meeting of the SPE, Dallas, Texas, Sep. 21-24, 1980.

Seleznev, N., Boyd, A., Habashy, T., Straley, C., and Luthi, S. "Dielectric Measurement for Solid Cylindrical Samples." Proceedings of the 2004 Annual Symposium of the Society of Core Analysts, SCA-20, Oct. 5-9, 2004.

Shen, L.C. "A Laboratory Technique for Measuring Dielectric Properties of Core Samples at Ultra High Frequencies." SPE paper 12552, 1983.

Taherian, R., Habashy T., Yuen J., Kong J., "A Coaxial-Circular Waveguide for Dielectric Measurement." IEEE Trans. Geoscience and Remote Sensing, vol. 29, No. 2, Mar. 1991: pp. 321-330.

W.B. Weir, "Automatic Measurement of Complex Dielectric Constant and Permeability at Microwave Frequencies." Proc, IEEE, vol. 62, No. 1, Jan. 1974: pp. 33-36.

\* cited by examiner

METHOD AND DEVICE FOR COMPLEX PERMITTIVITY MEASUREMENTS AS A FUNCTION OF FREQUENCY

FIELD OF THE INVENTION

This invention relates to the measurement of the complex permittivity of various substances as a function of frequency, for example rock samples from earth formations and, more particularly, to a method and device for implementing such measurements. The invention also relates to an adapter and technique for seamless transition between waveguides of different diameters.

BACKGROUND OF THE INVENTION

The knowledge of the permittivity and its frequency behavior is important in both basic and applied research. The dielectric material properties are relevant for the design of radio-frequency and microwave devices, e.g. in mobile communication systems. Dielectric measurements can help control manufacturing processes. For example, changes in the viscosity and cure state of thermosetting resins can be monitored via changes in the dielectric properties of the material. The measurements can be made in actual processing environments such as presses, autoclaves, and ovens. In the agricultural sector the dielectric properties of food products can be used for the indirect determination of product quality factors such as moisture content, dry-matter content, and maturity. The dielectric measurement is a particularly informative technique for geophysical applications (see, for example, Calvert, T. J., Rau N. R., "Electromagnetic Propagation . . . A New Dimension in Logging", SPE paper 6542, 1977). Nearly an order of magnitude separates the value of water dielectric constant from that of the other formation constituents. Thus, measurements of the effective formation permittivity are sensitive to the formation water content.

In the laboratory, dielectric properties can be measured by different methods employing various sample sizes and shapes (see, for example, H. E. Bussey, "Measurement of RF Properties of Materials. A Survey", Proc. IEEE, vol. 55, pp. 1046-1053, 1967; Baker-Jarvis, J., Janezic, M. D., Riddle, B. F., Johnk, R., Kabos, P., Holloway, C. L., Geyer, R. G., Grosvenor, C. A., "Measuring the Permittivity and Permeability of Lossy Materials: Solids, Liquids, Metals, Building Materials, and Negative-index Materials", NIST Technical Note 1536, 2004). The measurement technique depends on the frequency of interest. At frequencies up to several MHz a capacitive technique is typically employed. The material is placed in between the plates of a capacitor, and from the measurements of capacitance, the dielectric constant can be calculated. The capacitance model works well if the wavelength is much longer than the conductor separation.

However, for higher frequencies, especially in the GHz region, more sophisticated techniques need to be used, such as a transmission line or a microwave resonator. Transmission line methods are widely utilized because they allow for broadband measurements. In the past, coaxial transmission lines (also called "coaxial cells") were commonly utilized. (See, for example, L. C. Shen, "A Laboratory Technique for Measuring Dielectric Properties of Core Samples at Ultra High Frequencies", SPE paper 12552, 1983; W. B. Weir, "Automatic Measurement of Complex Dielectric Constant and Permeability at Microwave Frequencies", Proc, IEEE, vol. 62, no. 1, pp. 33-36, 1974; R. N. Rau and R. P. Wharton, "Measurement of Core Electrical Parameters at UHF and Microwave Frequencies", SPE 9380, 55th Annual Meeting of the SPE, Dallas, Tex., 1980).

The configuration of a prior art coaxial cell 100 containing a sample 105 is shown in the FIG. 1. A coaxial transmission line includes a center conductor 110 and an outer conductor 120. The sample 105 has the shape of a cylinder with the hole in the center, and is placed in between the outer and the inner electrodes in a section of the coaxial transmission line. The transmission and the reflection coefficients of the line can be related to the permillivity and the conductivity of the sample. The knowledge of both reflection and transmission coefficients (or, in the other words, the knowledge of all S-parameters of this line) allows for closed form expression derivation and simplifies the computation of permittivity and conductivity from experimental data. However, the coaxial lines require a coaxial sample that is placed, as shown, in the section of the line filling the space between the central and the outer conductors. In some cases, creating such a coaxial sample is easy, as with a liquid sample. In other cases, the inability to precisely shape the sample can limit the use of a coaxial cell. In the case of weakly consolidated materials, it is difficult to machine such a sample. This can be especially true for rock materials, such as coring samples, which usually must be ground into shape rather than using more conventional machining methods.

An improved cell, shown in FIG. 2, which has central conductor 210 and outer conductor 220, uses a cylindrically shaped sample 205 in an open section, and avoids the disadvantages of the common coaxial cell (see Taherian R., Habashy T., Yuen J., Kong J., "A Coaxial-Circular Waveguide for Dielectric Measurement", IEEE Trans. Geoscience and Remote Sensing, vol. 29, No. 2, 321-330, 1991). In addition, the study of the cell response showed that it has the larger dynamic range and higher sensitivity than a conventional coaxial cell. As shown, the coaxial-circular cell of FIG. 2 includes two coaxial waveguides connected through to a central cylindrical section. In other words, the coaxial waveguides are abruptly truncated at the faces of the sample 205, which resides in a central cylindrical section and makes electrical contact with the central electrodes of coaxial waveguides. The sample has a simple cylindrical geometry without a hole in the center.

The full wave forward model predicting the response of the cell of FIG. 2 as a function of the sample length, permittivity and conductivity was developed and is presented in Taherian, Habashy, Yuen, and Kong, 1991, supra. In combination with an inversion algorithm, this model allows the determination of the permittivity and conductivity of the sample from the measured scattering parameters (S-parameters). The permittivity and conductivity estimate at a given frequency can be obtained from each measured S-parameter, and the inversion algorithm makes use of all four S-parameters for the improved accuracy and reliability of the measurement. To suppress the multiple reflection of waves between the connector's terminals and the coaxial-circular junction, two criteria have to be satisfied: The first is that all the TM modes that are reflected back towards the connector have to be evanescent (i.e. below cutoff). This is achieved by choosing the dimensions of the coax in such a way that the propagation constant of each reflected TM mode is an imaginary quantity. This causes the attenuation of the reflected TM modes as they propagate back towards the connector. The second design criterion is to ensure that the connector absorbs the entire reflected TEM mode and that nothing is reflected back at the connector. This is done by choosing the connector's impedance to be equal to the wave impedance of the TEM mode, which was 50Ω in the example.

An example measurement of the permittivity and conductivity of 1Ω-m brine is shown in FIGS. 3 and 4. FIG. 3 shows permittivity as a function of frequency, and FIG. 4 shows conductivity as a function of frequency. The measured values are compared with those predicted by the Klein-Swift model for the 1Ω-m brine. (See Klein, L. A., and Swift, C. T., "An Improved Model for the Dielectric Constant of Sea Water at Microwave Frequencies", IEEE Trans. Antennas Propagt., vol. AP-25, pp. 104-111, 1977). It is evident from this comparison that measured dielectric data is in close agreement with the expected values.

It is among the objects of the invention to provide an improved apparatus for measuring properties, including complex dielectric permittivity, of samples as a function of frequency, with less restriction on the geometry and size of the sample than in prior art approaches.

It is also among the objects of the present invention to provide an improved connector for transition between coaxial waveguides of different diameters.

SUMMARY OF THE INVENTION

In accordance with a form of the invention, a device is set forth for transition between an end of a relatively small diameter coaxial waveguide, having an inner conductor and a relatively small inner diameter of its outer conductor, and an end of a relatively large diameter waveguide, having a relatively large inner diameter of its outer conductor, comprising: a connecting adapter having a first end coupleable with the relatively small diameter coaxial waveguide and a second end coupleable with the relatively large diameter waveguide, the adapter having inner and outer coaxial conductors; the inner conductor of the adapter having a diameter that tapers outwardly between the first and second ends, so as to correspond substantially at the first end with the inner conductor of the relatively small diameter coaxial waveguide; and the outer conductor of the adapter having an inner surface whose diameter tapers outwardly between the first and second ends, so as to correspond substantially at the first end with the inner diameter of the outer conductor of the relatively small diameter coaxial waveguide and correspond substantially at the second end with the inner diameter of the outer conductor of the relatively large diameter waveguide. In an embodiment of this form of the invention, the inner conductor of the adapter has a truncated conical shape with the frustum thereof facing the first end and the base thereof facing the second end. Also, the inner surface of the outer conductor of the adapter has a truncated conical shape with the frustum thereof facing the first end and the base thereof facing the second end.

Another form of the invention is an apparatus for use in a system that includes an electronic analyzer, such as a network analyzer, for determining a property of a sample material. The apparatus comprises: a cylindrical chamber for receiving the sample; a coaxial connector having a first relatively small diameter end coupleable with the analyzer and a second relatively large diameter end communicating with a side of the cylindrical chamber, the connector having inner and outer coaxial conductors; the inner conductor of the connector having a diameter that tapers outwardly from the first end to the second end, and the outer conductor of the connector having an inner surface whose diameter tapers outwardly from the first end to the second end. In an embodiment of this form of the invention, the first end of the connector is coupled with the analyzer via a coaxial cable, and the inner conductor of the connector has a diameter of the first end that corresponds substantially with the diameter of the inner coaxial conductor of the coaxial cable. Also, the inner surface of the outer conductor of the connector has a diameter at the second end that corresponds substantially with the inner diameter of the cylindrical chamber. Also in this embodiment, the ratio of the inner diameter of the connector's outer conductor to the diameter of the connector's inner conductor is substantially the same at all cross-sections along the axis of the connector to maintain a constant characteristic impedance that matches that of the network analyzer. An embodiment of this form of the invention further comprises another coaxial conductor having a first relatively small diameter end coupleable with the analyzer and a second relatively large diameter end communicating with the other side of the cylindrical chamber, the another connector having inner and outer coaxial conductors; the inner conductor of the another connector having a diameter that tapers outwardly from the first end to the second end, and the outer conductor of the another connector having an inner surface whose diameter tapers outwardly from the first end to the second end. In this embodiment, the cylindrical chamber is within a tubular cylindrical body, and the second ends of the connector and the another connector are inserted in opposing ends of the cylindrical body, whereby the cylindrical chamber is between the second ends.

Another form of the invention can be used for determining, at a wellsite, a property of a sample, such as a coring sample, from earth formations surrounding a borehole, comprising the steps of: obtaining, at the wellsite, a coring sample from the earth formations; providing, at the wellsite, an electric analyzer; providing, at the wellsite, an electrically conductive tubular cylindrical body; inserting the sample into an end of the body; inserting a pair of coaxial connectors into the body so that the sample is between the connectors, each of the connectors having a first relatively small diameter end coupled with the analyzer and a second relatively large diameter end adjacent the sample, each of the connectors having inner and outer coaxial conductors, the inner conductor of each connector having a diameter that tapers outwardly from the first end to the second end, and the outer conductor of each connector having an inner surface whose diameter tapers outwardly from the first end to the second end; and determining the property of the sample from measurements taken by the analyzer.

Further features and advantages of the invention will become more readily apparent from the following detailed description when taken in conjunction with the accompanying drawings.

DETAILED DESCRIPTION

Figure 5:
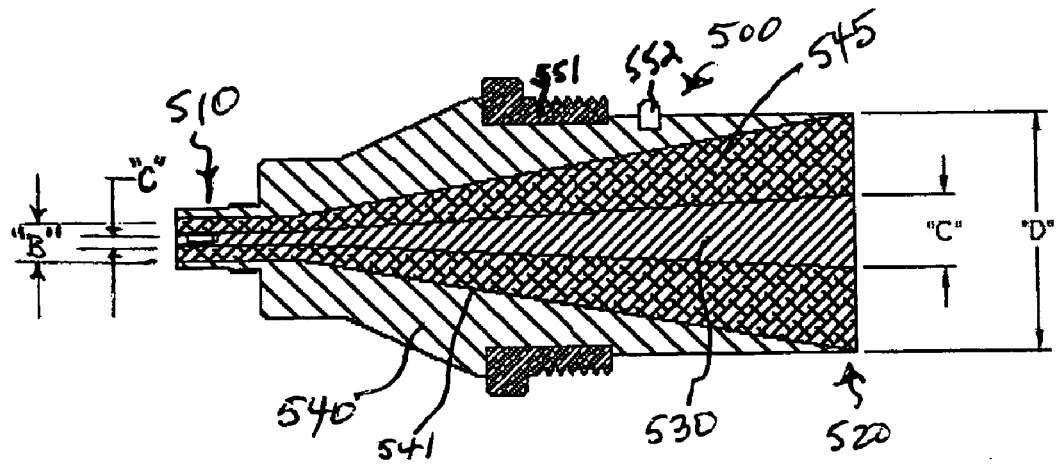
FIG. 5 is a cross-sectional view of a coaxial connector in accordance with an embodiment of the invention, and which can be used in practicing an embodiment of the method of the invention.

FIG. 5 shows a cross-section of a coaxial conical adapter in accordance with an embodiment of the invention. The adapter achieves seamless transition between, for example, coaxial cables or waveguides of different diameters. For example, a form of this embodiment was designed to allow seamless transition from a standard 7 mm RF cable to a 38.1 mm waveguide, and introduces minimal disturbance to the propagating RF signal for frequencies up to several GHz.

In the embodiment of FIG. 5, the adapter 500 has a first end 510 that is coupleable with a relatively small diameter coaxial waveguide (for example, a coaxial cable), and a second end 520 that is coupleable with a relatively large diameter waveguide (which may be for example, a relatively large diameter coaxial cable, or other type of waveguide). In the diagram of FIG. 5, the relatively small diameter coaxial cable and the end 510 of adapter 500 to which it is coupleable has an inner conductor of diameter A and an outer conductor with an inner diameter B. The relatively large diameter coaxial waveguide and the end 520 of adapter 500 to which it is coupleable has an inner conductor of diameter C and an outer conductor with inner diameter D. The inner conductor, labeled 530, is seen to taper outwardly in diameter from its smaller diameter A at the end 510 to its larger diameter C at its end 520. The tapered portion is seen to have a truncated conical shape, with the base of the cone disposed toward the end 520 and the frustum of the cone disposed toward the end 510. The outer conductor, labeled 540, has an inner surface whose diameter tapers outwardly, between the end 510 and the end 520 to form a conically shaped space 545. In the embodiment of FIG. 5, the space 545 is filled with a dielectric material, such as Teflon. Also in FIG. 5, 551 is a threaded join, and 552 is a stop.

The impedance of a coaxial line is:

$$Z_0 = \frac{\ln\left(\frac{D}{C}\right)}{2\pi}\sqrt{\frac{\mu^*}{\varepsilon^*}} \quad (1)$$

where C is the diameter of the inner conductor, D is the diameter of the outer conductor, and $\mu^*$ and $\varepsilon^*$ are, respectively, the magnetic permeability and permittivity of the material filling the space between the inner and outer conductor. In one example, Teflon was the filling material. It is seen that by keeping the ratio D/C a constant over the length of the adapter, the impedance at any cross section will remain constant. The dimensions of the adapter are chosen in such a way that, for example, its impedance is 50Ω at any cross-section. It will be understood that the adapter can be made to accommodate coaxial waveguides of various sizes.

Figure 6:
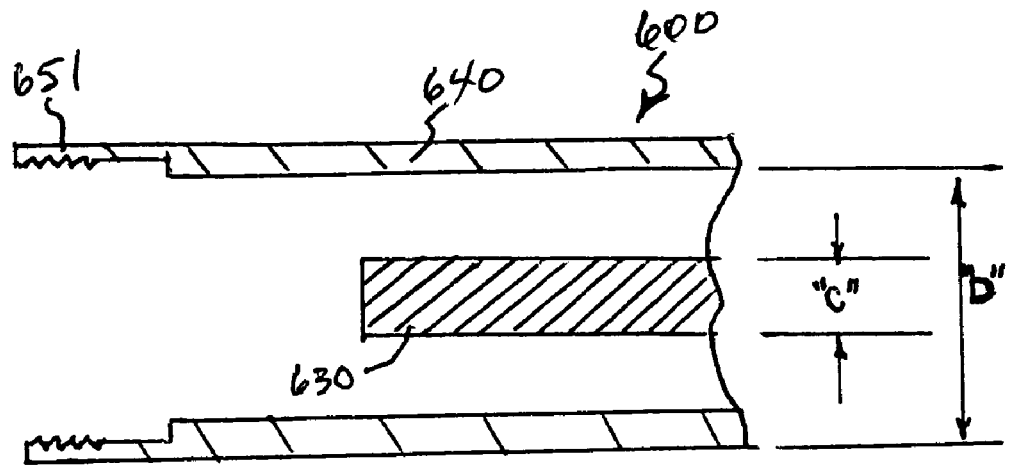
FIG. 6 is a cross-sectional view of a relatively large diameter coaxial waveguide, which can be coupled with the adapter of FIG. 5.

FIG. 6 shows an example of a relatively large diameter coaxial waveguide 600 that can connect with the larger end of adapter 500. The waveguide 600 includes inner conductor 630 of diameter C and outer conductor 640 of inner diameter D. Threading at 651 can be joined with threading at 551. A dielectric material can be used to fill the region between inner and outer conductors.

Figure 1:
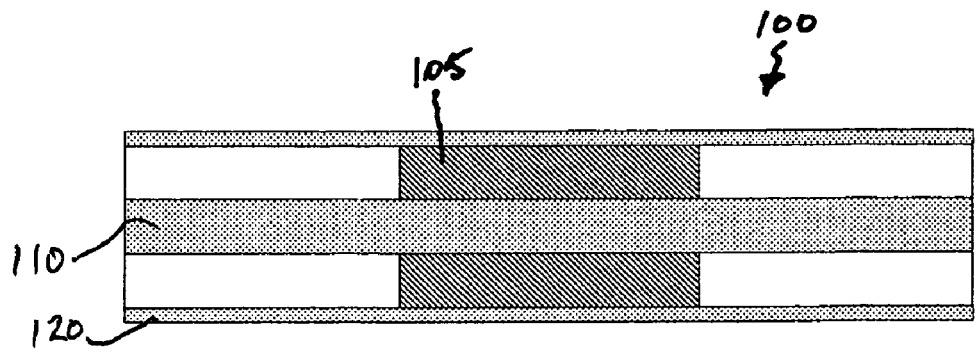
FIG. 1 is a cross-sectional view of a prior art cell for measuring dielectric properties of a sample.
Figure 2:
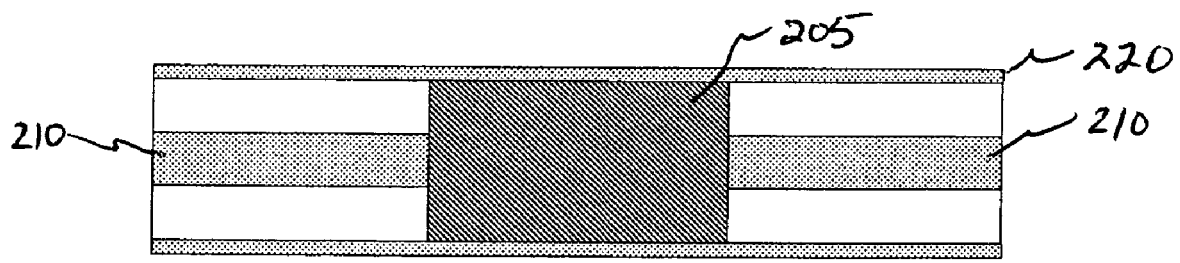
FIG. 2 is a cross-sectional view of another prior art cell for measuring dielectric properties of a sample.
Figure 3:
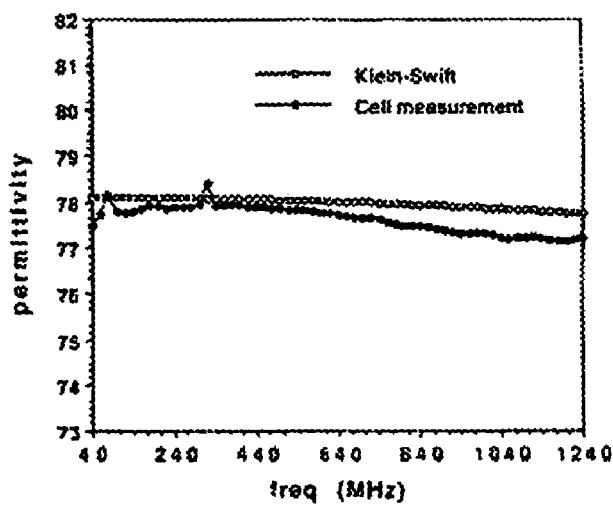
FIG. 3 is a diagram of dielectric permittivity as a function of frequency, and a comparative value thereof, as measured using a known technique.
Figure 4:
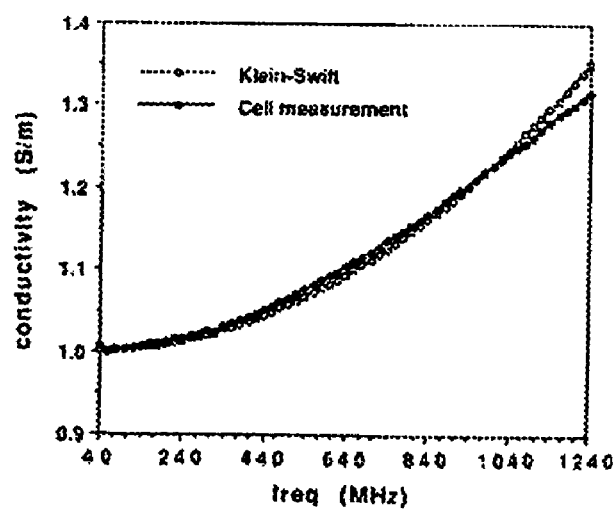
FIG. 4 is a diagram of conductivity as a function of frequency, and a comparative value thereof, as measured using a known technique.
Figure 7:
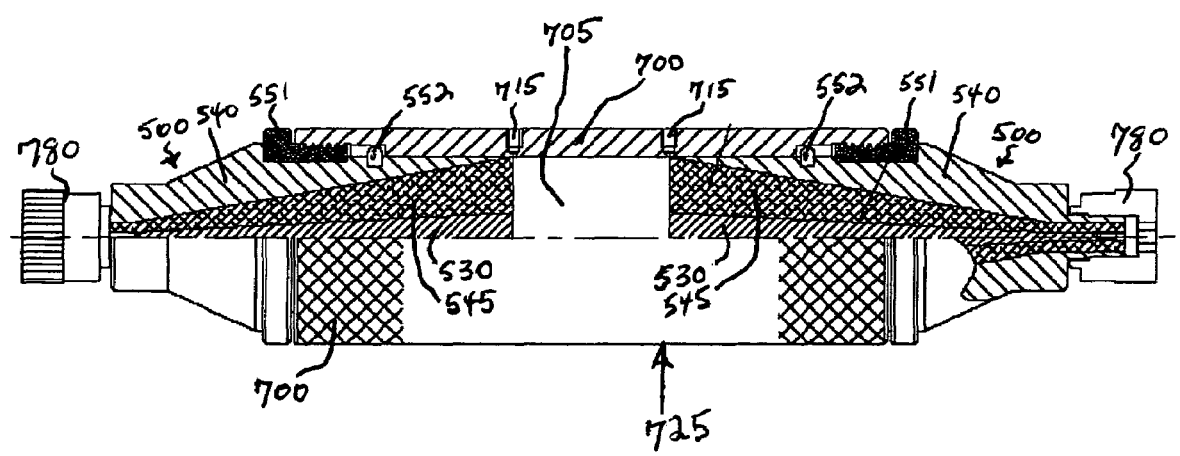
FIG. 7 is a diagram, partially broken away, and partially in cross section, of an apparatus in accordance with embodiment of the invention for measuring properties, such as dielectric permitivity and/or other properties, of sample materials.

The diameter of a sample that can be measured, for example, in the prior art coaxial-circular dielectric cell shown in FIG. 2, is fixed by the inner diameter of the circular waveguide section. In turn, the inner diameter of the circular section is equal to the inner diameter of the connecting coaxial cable and measurement device test ports and is, therefore, limited by it. It is desirable to measure samples of a larger diameter than the test ports of the measuring device, and such a capability is provided in the dielectric measurement system of the embodiment of the invention shown in FIG. 7. The dielectric measurement system of FIG. 7 includes a cylindrical body 700, formed for example of stainless steel, having open ends, into which two conical adapters 500, of the type shown in FIG. 5, are inserted, leaving a cylindrical chamber 705 between the relatively larger diameter ends of the adapters. In the embodiment of FIG. 7, vents are shown at 715 for venting fluids and air in the chamber, and sockets 780 are provided for coupling to coaxial cables which, in turn, couple to the network analyzer.

The dielectric measurement system of the FIG. 7 embodiment can accommodate standard laboratory samples in the shape of a cylinder with a diameter of 3.81 cm and a length of 3.81 cm. (Reference can be made to N. Seleznev, A. Boyd, T. Habashy, C. Straley, S. Luthi, "Dielectric Measurements for Solid Cylindrical Samples", Proceedings of the 2004 Annual Symposium of the Society of Core Analysts, SCA-20, Oct. 5-9, 2004, incorporated herein by reference.) In one example, the dielectric measurement system can be connected with a standard 7 mm coaxial cable to an Agilent 8753 ES network analyzer. The sample is located in chamber 705 sandwiched between the two tapered coaxial electrodes. The sample is preferably in electrical contact with the center conductors of the coaxial sections, which press against the sample's flat ends. The diameter of the sample holder in this example is 3.81 cm, and the center conductor of the coaxial section has the diameter of 1.17 cm. As above, the space between the center and outer conductors of the coaxial section is filled, for example, with Teflon.

The scattering parameters across the cell terminals can be measured by the network analyzer, and the data acquisition can be automated. All four S-parameters can be recorded in the form of an amplitude (in dB) and phase (in degrees). The accuracy of the S-parameter measurements can be enhanced with calibrations. The network analyzer can be calibrated with a conventional full two-port calibration set. This set includes a short, an open, and load standards. This calibration establishes the plane of measurements at the connection between the analyzer's coaxial cables and the cell terminals.

Although the conventional calibration is effective in removing systematic analyzer and cable errors, imperfections in manufacturing process can affect the cell response; for example, the conical end pieces may not respond exactly like 50Ω coaxial line. A number of procedures can be used to correct for these types of imperfections. For example, the plane of calibration can be moved to the faces of the cell's coaxial elements, which could be achieved by calibrating the network analyzer at the end of the cell coaxial sections. This approach has the advantage of providing complete error correction and requires a set of calibration standards, such as a short, an open, and a load. A liquid with known dielectric properties can be used as a load standard.

Another way to enhance the accuracy of measurements is to remove the influence of the adapter cones after the measurement. This could be done if the S-parameters of each cone were known. Due to reciprocity, the $S_{12}$ of one equals the $S_{21}$ of the other, and only three independent complex scattering parameters have to be defined. These parameters can be defined from the reflection measurements obtained on each cone separately and/or from the transmission measurements through both cones simultaneously.

Also, measurement normalization can be used. A correction based on a single measurement of a known standard has been successfully used previously (see Taherian, Habashy, Yuen, and Kong, 1991, supra). In that case the data was normalized with the measurement from an empty cell.

Although the embodiment of FIG. 7, which can be used in measurement of the sample using transmission and reflection modes, is preferred, it will be understood that the invention can also be employed to implement measurements with, for example, a single connection to the network analyzer, and with use of only a reflection mode. This could be implemented by terminating the cavity, such as with an end cap, at the position of arrow 725 in FIG. 7.

The invention claimed is:

1. For use in a system that includes an electronic analyzer for determining a property of a sample material, an apparatus comprising:
a cylindrical chamber for receiving the sample material;
a first coaxial connector having a first relatively small diameter end coupleable with said electronic analyzer and a second relatively large diameter end communicating with a side of said cylindrical chamber, said first coaxial connector having inner and outer coaxial conductors; said inner coaxial conductor of the first coaxial connector having a diameter that tapers outwardly from said first end to said second end, and said outer coaxial conductor of the first coaxial connector having an inner surface whose diameter tapers outwardly from said first end to said second end;
a second coaxial connector having a first relatively small diameter end coupleable with said electronic analyzer and a second relatively large diameter end communicating with the other side of said cylindrical chamber, said second coaxial connector having inner and outer coaxial conductors; said inner coaxial conductor of said second coaxial connector having a diameter that tapers outwardly from said first end to said second end, and said outer coaxial conductor of said second coaxial connector having an inner surface whose diameter tapers outwardly from said first end to said second end;
wherein said cylindrical chamber is within a tubular cylindrical body, and wherein the second ends of said first coaxial connector and said second coaxial connector are inserted in opposing ends of said cylindrical body, thereby defining said cylindrical chamber between said second ends and the internal wall of said tubular cylindrical body.

2. Apparatus as defined by claim 1, wherein said electronic analyzer is a network analyzer.

3. Apparatus as defined by claim 1, wherein said first ends of said first and second coaxial connectors are coupled with said electronic analyzer via coaxial cables, and wherein the inner coaxial conductors of said first and second coaxial connectors have diameters of said first ends that corresponds substantially with the diameters of the inner coaxial conductors of said coaxial cables.

4. Apparatus as defined by claim 3, wherein the inner surfaces of the outer coaxial conductors of said first and second coaxial connectors have diameters at said second ends that corresponds substantially with the inner diameter of said cylindrical chamber.

5. Apparatus as defined by claim 4, wherein said sample material is in the shape of a cylinder.

6. Apparatus as defined by claim 1, wherein the inner surfaces of the outer coaxial conductors of said first and second coaxial connectors have diameters at said second ends that corresponds substantially with the inner diameter of said cylindrical chamber.

7. Apparatus as defined by claim 6, wherein, the ratio of the inner diameters of the first and second coaxial connectors' outer coaxial conductors to the diameter of the first and second coaxial connectors' inner coaxial conductors is substantially the same at all cross-sections along the axis of the coaxial connectors.

8. Apparatus as defined by claim 6, wherein the inner coaxial conductors of said first and second coaxial connectors have truncated conical shapes with the frustums thereof facing said first ends and the bases thereof facing said second ends.

9. Apparatus as defined by claim 6, wherein the inner surface of the outer coaxial conductors of said first and second coaxial connectors have truncated conical shapes with the frustums thereof facing said first ends and the bases thereof facing said second ends.

10. Apparatus as defined by claim 1, wherein said sample material is in the shape of a cylinder.

11. Apparatus as defined by claim 1, further comprising a dielectric material in the space between the inner and outer coaxial conductors of said first and second coaxial connectors.

12. A method for determining a property of a sample material, comprising the steps of:
providing an electronic analyzer;
providing an electrically conductive tubular cylindrical body;
inserting the sample material into an end of the body;
inserting a pair of coaxial connectors into the body so that the sample is
adjoining the coaxial connectors, each of said coaxial connectors having a first relatively small diameter end coupled with said electronic analyzer and a second relatively large diameter end adjacent the sample, each of said coaxial connectors having inner and outer coaxial conductors, said inner coaxial conductor of each coaxial connector having a diameter that tapers outwardly from said first end to said second end, and said outer coaxial conductor of each coaxial connector having an inner surface whose diameter tapers outwardly from said first end to said second end; and
determining said property of said sample material from measurements taken by said electronic analyzer.

13. The method as defined by claim 12, wherein said step of providing an electronic analyzer comprises providing a network analyzer.

14. The method as defined by clam 12, wherein said determined property is complex dielectric permittivity as a function of frequency.

15. The method as defined by claim 12, wherein said sample material is a cylindrically shaped sample.

16. The method as defined by claim 15, wherein said cylindrically shaped sample is a coring sample from an earth formation.

17. A method for determining, at a wellsite, a property of a sample from earth formations surrounding a borehole, comprising the steps of:
obtaining, at the wellsite, a coring sample from said earth formations;
providing, at the wellsite, an electronic analyzer;
providing, at the wellsite, an electrically conductive tubular cylindrical body;
inserting the coring sample into an end of the body;

inserting a pair of coaxial connectors into the body so that the sample is adjoining the coaxial connectors, each of said coaxial connectors having a first relatively small diameter end coupled with said electronic analyzer and a second relatively large diameter end adjacent the coring sample, each of said coaxial connectors having inner and outer coaxial conductors, said inner coaxial conductor of each coaxial connector having a diameter that tapers outwardly from said first end to said second end, and said outer coaxial conductor of each coaxial connector having an inner surface whose diameter tapers outwardly from said first end to said second end; and determining said property of said coring sample from measurements taken by said electronic analyzer.

18. The method as defined by claim 17, wherein said step of providing an electronic analyzer comprises providing a network analyzer.

19. The method as defined by claim 17, wherein said property is dielectric permittivity as a function of frequency.

\* \* \* \* \*